: US 9,336,342 B2
(45) Date of Patent: May 10, 2016

(54) MEMORY HARD MACRO PARTITION OPTIMIZATION FOR TESTING EMBEDDED MEMORIES

(75) Inventors: Yervant Zorian, Santa Clara, CA (US); Karen Darbinyan, Pleasanton, CA (US); Gevorg Torjyan, Fremont, CA (US)

(73) Assignee: Synopsys, Inc., Mountain View, CA (US)

( * ) Notice: Subject to any disclaimer, the term of this patent is extended or adjusted under 35 U.S.C. 154(b) by 742 days.

(21) Appl. No.: 13/243,897

(22) Filed: Sep. 23, 2011

(65) Prior Publication Data

US 2013/0080847 A1    Mar. 28, 2013

(51) Int. Cl.
*G06F 17/50* (2006.01)
*G11C 29/16* (2006.01)
*G01R 31/3185* (2006.01)
*G11C 29/12* (2006.01)
*G11C 29/32* (2006.01)
*G11C 29/04* (2006.01)

(52) U.S. Cl.
CPC .... *G06F 17/5031* (2013.01); *G01R 31/318536* (2013.01); *G01R 31/318572* (2013.01); *G06F 17/505* (2013.01); *G06F 17/5068* (2013.01); *G11C 29/12* (2013.01); *G11C 29/16* (2013.01); *G11C 29/32* (2013.01); *G11C 2029/0401* (2013.01)

(58) Field of Classification Search
CPC .............. G06F 17/5031; G06F 17/505; G06F 17/5068; G01R 31/318572; G01R 31/318536; G11C 29/12; G11C 29/16
USPC ........... 716/134, 113, 110, 132; 714/727, 733
See application file for complete search history.

(56) References Cited

U.S. PATENT DOCUMENTS

| 5,138,619 | A | * | 8/1992 | Fasang et al. ................. 714/718 |
| 5,546,406 | A | * | 8/1996 | Gillenwater et al. ......... 714/733 |
| 5,553,082 | A | * | 9/1996 | Connor et al. ................ 714/733 |
| 5,568,437 | A | * | 10/1996 | Jamal ............................ 365/201 |

(Continued)

FOREIGN PATENT DOCUMENTS

| CN | 102025866 A | 4/2011 |
| EP | 0929900 B1 | 11/2001 |

OTHER PUBLICATIONS

PCT International Search Report and Written Opinion, PCT Application No. PCT/US12/55944, Nov. 20, 2012, 17 pages.

(Continued)

*Primary Examiner* — Joseph D Torres
(74) *Attorney, Agent, or Firm* — Fenwick & West LLP

(57) ABSTRACT

A memory hard macro designed to support multiple design for test (DFT) techniques having signal paths associated with the DFT techniques and the functional operation of the memory instance that share logic devices or components. The memory hard macro includes a functional input port and a functional output port, forming a functional memory data path, which includes input latches from the memory instance. The memory hard macro also includes a scan input port and a scan output port, forming a scan data path, which includes input latches from the array of data buffer circuits and output latches from the array of sense amplifiers. The memory hard macro further includes a BIST input port and a BIST output port, forming a BIST data path, which includes at least one input latch from the array of data buffer circuits and at least one output latch from the array of sense amplifiers.

9 Claims, 8 Drawing Sheets

(56) References Cited

U.S. PATENT DOCUMENTS

| | | | |
|---|---|---|---|
| 5,675,545 A * | 10/1997 | Madhavan et al. | 365/201 |
| 5,761,215 A * | 6/1998 | McCarthy et al. | 714/726 |
| 5,930,185 A | 7/1999 | Wendell | |
| 5,961,653 A * | 10/1999 | Kalter et al. | 714/6.32 |
| 5,968,192 A * | 10/1999 | Kornachuk et al. | 714/724 |
| 5,982,681 A | 11/1999 | Schwarz | |
| 6,067,262 A * | 5/2000 | Irrinki et al. | 365/201 |
| 6,367,042 B1 * | 4/2002 | Phan et al. | 714/733 |
| 6,370,661 B1 * | 4/2002 | Miner | 714/718 |
| 6,415,390 B1 | 7/2002 | Manning | |
| 6,560,740 B1 * | 5/2003 | Zuraski et al. | 714/733 |
| 6,567,325 B1 * | 5/2003 | Hergott | 365/201 |
| 6,574,762 B1 * | 6/2003 | Karimi et al. | 714/727 |
| 6,587,979 B1 * | 7/2003 | Kraus et al. | 714/720 |
| 6,651,202 B1 * | 11/2003 | Phan | 714/733 |
| 6,671,837 B1 * | 12/2003 | Reohr et al. | 714/719 |
| 6,769,081 B1 * | 7/2004 | Parulkar | 714/733 |
| 6,940,766 B2 * | 9/2005 | Konuk et al. | 365/200 |
| 7,085,971 B2 | 8/2006 | Barth, Jr. et al. | |
| 7,093,176 B2 * | 8/2006 | Nicolaidis et al. | 714/733 |
| 7,103,814 B2 * | 9/2006 | Corbin et al. | 714/726 |
| 7,184,936 B1 * | 2/2007 | Bhandari | 702/189 |
| 7,216,262 B2 * | 5/2007 | Martinez | 714/42 |
| 7,254,762 B2 * | 8/2007 | Anzou et al. | 714/733 |
| 7,257,745 B2 * | 8/2007 | Huott et al. | 714/710 |
| 7,260,758 B1 * | 8/2007 | Agrawal et al. | 714/733 |
| 7,322,000 B2 * | 1/2008 | Colunga et al. | 714/727 |
| 7,437,645 B2 * | 10/2008 | Fukuyama et al. | 714/736 |
| 7,487,419 B2 * | 2/2009 | Mukherjee et al. | 714/729 |
| 7,508,724 B2 | 3/2009 | Pyeon | |
| 7,539,598 B2 * | 5/2009 | Jang et al. | 702/185 |
| 7,656,731 B2 | 2/2010 | Jung et al. | |
| 7,954,029 B2 * | 5/2011 | Resnick | 714/733 |
| 8,145,958 B2 * | 3/2012 | Aitken et al. | 714/718 |
| 2001/0044918 A1 | 11/2001 | Sato et al. | |
| 2003/0084386 A1 | 5/2003 | Barth, Jr. et al. | |
| 2003/0167431 A1 * | 9/2003 | Nicolaidis et al. | 714/733 |
| 2004/0030976 A1 * | 2/2004 | Ghameshlu et al. | 714/732 |
| 2005/0044467 A1 | 2/2005 | Leung et al. | |
| 2008/0239847 A1 | 10/2008 | Jung et al. | |
| 2010/0135092 A1 | 6/2010 | Pyeon | |
| 2011/0058214 A1 * | 3/2011 | Park et al. | 358/1.15 |

OTHER PUBLICATIONS

Chinese Office Action, Chinese Application No. 201280054443.8, Jun. 30, 2015, 8 pages (with concise explanation of relevance).

* cited by examiner

| Mode | SWT | BISTE | CD | CAPT | DR_CTL | SE | SEQ | Preload | BIST DATA,WEM, ADR, CTL |
|---|---|---|---|---|---|---|---|---|---|
| Functional | 0 | 0 | 0 | 1 | 0 | 0 | 0 | X | X |
| ATPG | 1 | reg | reg | reg | reg | ATPG controlled | ATPG controlled | Reg | reg |
| BIST | 0 | 1 | MBIST control | MBIST control | MBIST control | 0 | MBIST control | 0 | MBIST control |
| IEEE1500 | 0 | 1 | 0 | MBIST control | 1 | 0 | MBIST control | 1 | MBIST control |

*FIG. 7*

|  | SE_Q | CD | CAPT | DR_CTL | Result QP |
|---|---|---|---|---|---|
| Reset | 0 | X | 1 | 0 | 0 |
| Pipeline | 0 | 0 | 1 | 0 | Q_mem$^{-1}$ |
| MBIST pass through | 0 | Compare Data | 1 | 0 | Q_mem^Compare_data |
| MBIST accumulate | 0 | Compare Data | 1 | 1 | (Q_mem^Compare_data) \| QP$^{-1}$ |
| IEEE1500 capture | 0 | 0 | 1 | 1 | Q_mem |
| Shift | 1 | X | X | X | MBIST Cell[i-1] |
| Data Retention | 0 | 0 | 0 | 1 | No state change |

*FIG. 8*

MEMORY HARD MACRO PARTITION OPTIMIZATION FOR TESTING EMBEDDED MEMORIES

BACKGROUND

1. Field of Art

This disclosure generally relates to techniques for testing embedded integrated circuits. In particular, and without limitation, the present disclosure relates to systems and methods for testing embedded memory instances formatted as a memory hard macro.

2. Description of the Related Art

Embedded memories consume an ever-increasing amount of die area in a wide variety of system-on-chip (SoC) devices. Driven partially by advances in semiconductor process technologies, die area populated with embedded memory cover greater than eighty percent of the overall die area in many SoCs. And because embedded memory may cover a substantial amount of die area, embedded memory can be more vulnerable to defects resulting from wafer fabrication and other manufacturing and assembly steps. Reduced feature size resulting from advance semiconductor process technologies may also increase the probability of the occurrence of fabrication defects.

To improve test coverage for faults resulting from these defects, SoC designers may use a combination of design for test techniques. For example, some design for test techniques target the embedded memory instance. Other design for test techniques may target verification of one or more signal paths that include input pins coupled to receive external data, test logic surrounding the memory instance, and output pins coupled to transmit the received data. Additional design for test techniques may include adding standardized interface logic around each embedded memory instance to facilitate testing of multiple embedded memory instances individually, in parallel, or in a daisy-chain manner.

Adding test or shadow logic specialized for a particular design for test technique may improve fault coverage at the expense of performance density. Additional test logic consumes die area that could otherwise be used for the functional operation of the SoC. And for many high speed designs, surrounding a memory core with additional test logic increases the routing complexity to the memory instance and protracts timing closure.

It is therefore desirable to have systems or methods to provide improved design for test methodologies that optimize SoC performance density and reduce the efforts associated with timing closure.

BRIEF DESCRIPTION OF THE DRAWINGS

The accompanying drawings, which are incorporated in and constitute a part of this specification, illustrate embodiments disclosed herein, together with the description, serve to explain the principles of the disclosed embodiments:

FIG. 7 illustrates a table of operational modes of an exemplary memory hard macro consistent with disclosed embodiments.

FIG. 8 illustrates another table of operational modes of an exemplary memory hard macro consistent with the disclosed embodiments.

DETAILED DESCRIPTION

Figure 1:
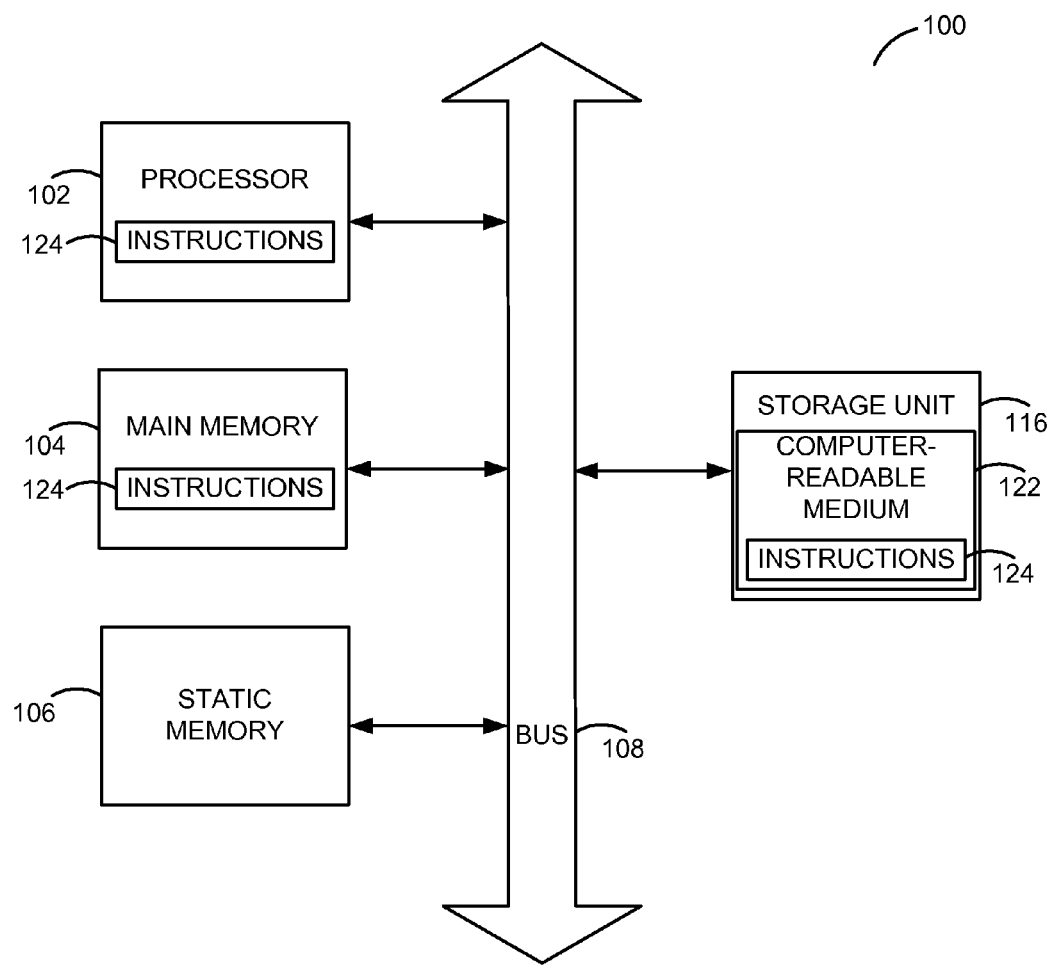
FIG. 1 illustrates a block diagram of an exemplary system consistent with the disclosed embodiments.

Reference will now be made in detail to disclosed embodiments illustrated in the accompanying drawings. Wherever possible, the same reference numbers will be used throughout the drawings to refer to the same or like portions. It should be noted that the drawings are in greatly simplified form and are not to precise scale.

Configuration Overview

Embodiments of the present disclosure relate to optimizing the resource partitioning within a memory hard macro to support multiple techniques for testing an embedded memory instance and associated test logic. Optimizing partitioning includes, among other things, using a combination of test logic and peripheral memory logic included in a memory instance to support the operation of multiple techniques for testing embedded memories. By doing so, signal paths associated with different test techniques and the functional operation of the memory instance may share logic devices or components. The test techniques, for example, may include, without limitation, Memory Built-in Self Test (MBIST), Automated Test Pattern Generation (ATPG) scan, functional pipeline, and IEEE std 1500. Partitioning a memory hard macro in this manner, reduces area overhead associated with test, reduces the complexity of timing closure, minimizes routing to the memory instance, and improves fault coverage.

In the following description, the term "memory instance" refers to an instantiation of one or more memory blocks or banks on a die. Each block may include one or more memory arrays and associated peripheral logic used to read data from and write data to the memory array(s). For example, a memory instance may include an embedded static random access memory (SRAM), or other memory technology that operate without a refresh cycle. A Memory instance may also include dynamic random access memories (DRAM), content-addressable memory (CAM), or radio frequency (RF) memory.

The use of the singular includes the plural unless specifically stated otherwise. In this description, the use of "or" means "and/or" unless stated otherwise. Furthermore, the use of the term "including," as well as other forms such as "includes" and "included," is not limiting. In addition, terms such as "element" or "component" encompass both elements and components comprising one unit, and elements and components that comprise more than one subunit, unless specifically stated otherwise.

Furthermore, the terms "coupled" and "connected," along with their derivatives, may be used. It should be understood that these terms are not intended as synonyms for each other. Rather, in particular embodiments, "connected" and/or "coupled" may be used to indicate that two or more elements are in direct physical or electronic contact with each other. However, "coupled" may also mean that two or more elements are not in direct contact with each other, but yet still cooperate, communicate, and/or interact with each other. The section headings used herein are for organizational purposes only, and are not to be construed as limiting the subject matter described.

Computing Machine Architecture

FIG. 1 is a block diagram illustrating components of an exemplary machine configured to read instructions from a computer readable medium and execute them in a processing device. Specifically, FIG. 1 shows a diagrammatic representation of a machine in the example form of a computer system 100 within which instructions 124 (e.g., software) for causing the machine to perform any one or more of the methodologies discussed herein may be executed. In alternative embodiments, the machine operates as a standalone device or may operate in a distributed manner be connected (e.g., networked) to other machines. In a networked deployment, the machine may operate as a server machine or a client machine in a server-client network environment, or as a peer machine in a peer-to-peer (or distributed) network environment.

The machine may be a server computer, a client computer, a personal computer (PC), or any machine suitable to execute instructions 124 (sequential or otherwise) that specify actions to be taken by that machine. Further, while only a single machine is illustrated, the term "machine" shall also be taken to include any collection of machines that individually or jointly execute instructions 124 to perform any one or more of the methodologies discussed herein. For example, instructions 124 may perform a memory compiler operation to enable a designer to assemble a customized memory hard macro for a particular SoC consistent with the methodologies discussed herein.

Exemplary computer system 100 may include one or more of a processor 102 (e.g., a central processing unit (CPU), a graphics processing unit (GPU), a digital signal processor (DSP), one or more application specific integrated circuits (ASICs)), a main memory 104, a static memory 106, and a storage unit 116 configured to communicate with each other via a bus 108. Processor 102 may be a specialize processor in that in may be configured and programmed to operate as a memory hard macro partition optimization processor programmed to exchange commands and data with main memory 104, static memory 106, and storage unit 116.

The storage unit 116 includes a computer readable medium 122 storing instructions 124 (e.g., software) embodying any one or more of the methodologies or functions described herein. The instructions 124 (e.g., software) may also reside, completely or at least partially, within the main memory 104 or within the processor 102 (e.g., within a processor's cache memory) during execution thereof by the computer system 100, the main memory 104 and the processor 102 also constituting computer readable media.

While computer readable medium 122 is shown in an example embodiment to be a single medium, the term "computer readable medium" should be taken to include a single medium or multiple media (e.g., a centralized or distributed database, or associated caches and servers) able to store instructions (e.g., instructions 124). The term "computer readable medium" shall also be taken to include any tangible medium that is capable of storing instructions (e.g., instructions 124) for execution by the machine and that cause the machine to perform any one or more of the methodologies disclosed herein. The term "computer readable medium" includes, but not be limited to, tangible data repositories in the form of solid-state memories, optical media, and magnetic media.

Memory Hard Macro Architecture

Figure 2:
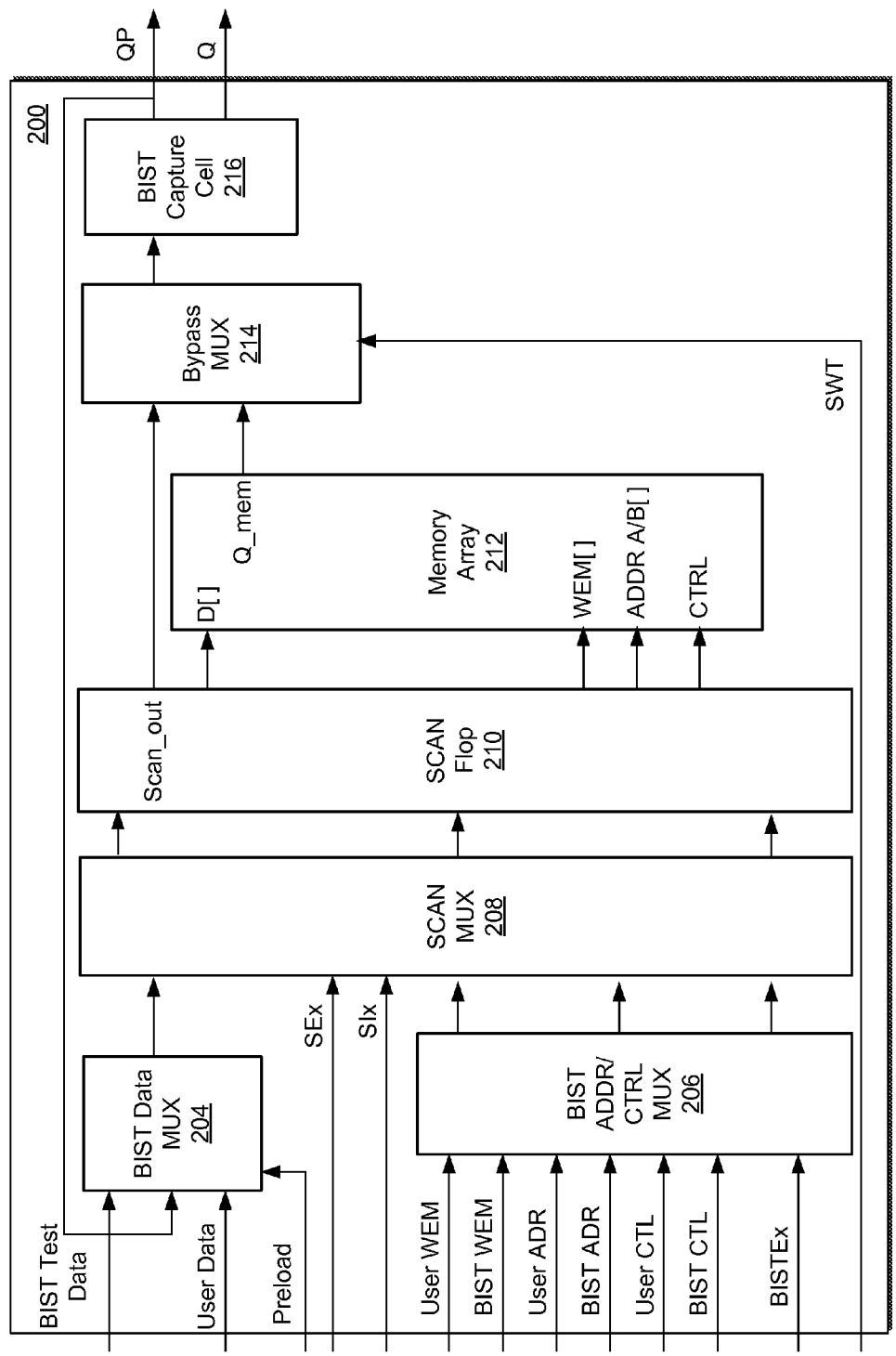
FIG. 2 illustrates a block diagram of an exemplary memory hard macro consistent with the disclosed embodiments.

FIG. 2 illustrates a block diagram of an exemplary memory hard macro 200 consistent with the disclosed embodiments.

In the following description, the term "hard macro" refers to the design of a logic function on a semiconductor device that specifies the physical connections of logic elements and/or circuits and specifies the physical pathways and wiring patterns between the components. A hard macro may also refer to a grouping of circuit instances constrained to each other due to physical location or some other characteristic. Though the physical location a circuit instance may be constrained within a hard macro, the location of the hard macro in the floor plan of a die may or may not be fixed.

As illustrated in FIG. 2, memory hard macro 200 includes a grouping of circuit instances included within macro boundary 202. Macro boundary 202 may include ports coupled to receive data from or transmit data to one or more signal paths associated with the functional operation of the memory instance and test operating modes. For simplicity, a single memory array is depicted, along with associated test circuitry and peripheral memory circuitry. The location of peripheral memory circuitry is not intended to reflect a physical location, but instead is depicted in a manner to aid in the understanding of the respective signal paths of functional operation and test operation modes. For example, signal paths may include, without limitation, a functional memory data path, a scan data path, a BIST data path, and a serial test data path.

Embodiments consistent with the present disclosure include memory configurations having multiple memory arrays along with multiple instantiations of the grouping of circuit instances as described below. By way of example, and as illustrated in FIG. 2, the grouping of circuit instances may include BIST multiplexers—BIST data mux 204 and BIST address/control mux 206, scan mux 208, scan flip-flop 210, memory array 212, bypass mux 214, and BIST capture circuit 216. Though not shown in FIG. 2, BIST data mux 204, scan mux 208, scan flip-flop 210, bypass mux 214, and BIST capture circuit 216 may be replicated for each memory data input/output (I/O) included in the memory instance. Similarly, BIST address/control mux 206, scan mux 208, and scan flip-flop 210 may be replicated for each memory address/control input. Furthermore, memory hard macros consistent with other embodiments may include alternative and/or additional circuits architected in a manner to perform the methodologies as discussed herein. Further detail of each circuit instance included in memory hard macro 200 is covered in the description of FIGS. 3-6.

To provide physical and logical interfaces to other macros or circuits, ports included in macro boundary 202 may include one or more pin types. For example, memory hard macro 200 may include, among other pin types, user pins, test pins, and output pins. User pins may include user data input pin coupled to the input of BIST data mux 204, and user write enable mask (WEM), user address (ADDR), and user control (CTL) pins coupled to the input of BIST address/control mux 104. Though represented in FIG. 2 as a single transmission path, each user pin may represent one or more pins that form a bus or other interface suitable to exchange information with memory hard macro 100. For example, user data input may be a port or interconnect that includes a plurality of pins suitable to transmit in parallel a signal formatted as follows: user D [NB], where NB represents the number of bits or word size associated with the user data input bus. Similarly, user WEM input may be an interconnect that includes a plurality of pins suitable to transmit in parallel a signal formatted manner similar to user D [NB]. User ADDR input may also be an interconnect that includes a plurality of pins suitable to transmit in parallel as address signal formatted as flows: ADDR [$\log_2(NA)$], where NA represents the number of address bits. User CTL input pin may also include a plurality of pins configured to carry distinct control signals including, but not limited to, mask enable (ME), write enable (WE), and chip enable (CE).

Memory hard macro 200 may also include test pins BIST enable (BISTE) coupled to one or more select inputs of BIST data mux 204 and BIST address/control mux 104, BIST write enable mask (WEM) coupled to an input of BIST address/control mux 104, and preload coupled to one of the select inputs of BIST data mux 204. To reduce the test port count, preload may be shared by all multiplexers within memory hard macro 200. Test pins may also include synchronous memory bypass (SWT) coupled to a select input of bypass mux 112, and ATPG scan input (SI) and scan enable (SE) coupled to the input of scan mux 106. Though not illustrated in FIG. 2, additional test pins described in FIG. 6 include capture enable (CAPT), data retention control (DR_CTL), compare data (CD), and MBIST circuit scan enable (SEQ) coupled to inputs of BIST capture circuit 114. In some embodiments, signals corresponding to SWT, BISTE, CAPT, DR_CTL, SE, and SEQ may be grouped or routed inside memory hard macro 200 in a manner to minimize external routing. In these embodiments, preferably one pin extends from memory hard macro boundary 202 to receive and/or transmit a corresponding signal, which may then be distributed to appropriate circuit instance within memory hard macro 200.

Alternatively or additional, pins corresponding to CAPT, DR_CTL, preload, and CD may be registered external to memory hard macro 200. Test pins BIST WEM, BIST data, and CD may include a plurality of pins suitable to transmit a plurality of signals in a manner previous described concerning user input pins. For example, test input BIST WEM may include a plurality of pins suitable to transmit in parallel a signal formatted as follows: BIST WEM [NB], where NB represents the number of bits or word size associated with the user data input bus.

To reduce the number of external pins, in some embodiments, signal pins associated with BIST Data, CD, and WEM may be represented to memory hard macro 200 as a reduced or compressed number of bits. Once received, hard memory macro 200 may execute a modulo operation to decompress the number of received bits. For example, such a modulo operation may operate in accordance with the following equation:

$$\text{Internal}[x] = \text{External}[x \bmod M] \qquad \text{Equation (1)}$$

where N represents the bit width of the bus internal to memory hard macro 200, M represents the bit width of the bus external to memory hard macro 200, and x represents the bit number of the memory bus internal to the memory hard macro 200. Memory hard macro 200 may also include output pins, memory output Q[NB] and memory pipeline output QP[NB], where, as previously discussed, NB represents the number of bits or word size associated with the user data input bus.

Figure 3:
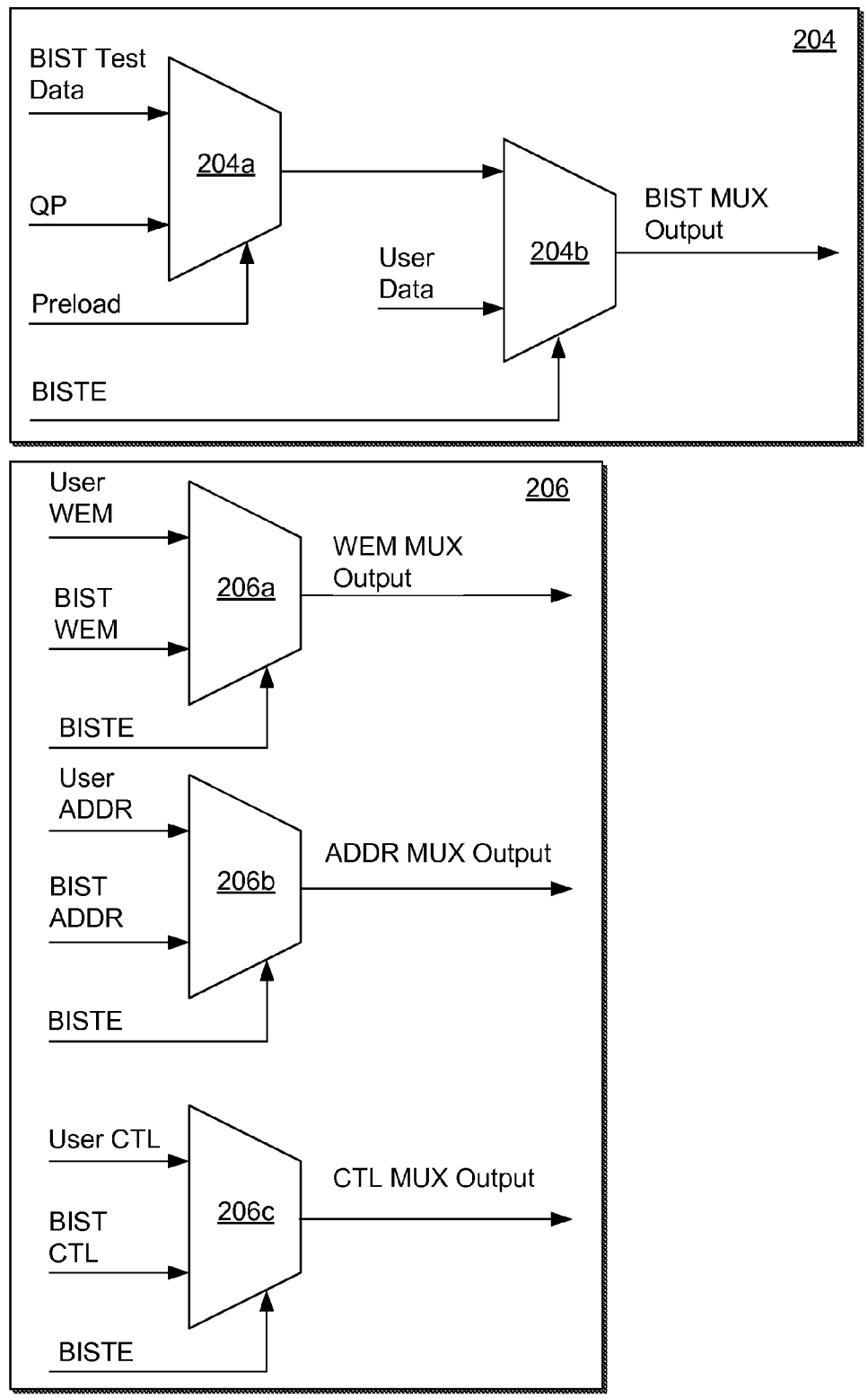
FIG. 3 illustrates a block diagram of exemplary BIST multiplexer circuits consistent with the disclosed embodiments.

FIG. 3 illustrates a block diagram of exemplary BIST multiplexer circuits consistent with the disclosed embodiments. The term mux or multiplexer as used herein may be any circuit suitable to allow the selection of signals received on one or more inputs for transmission to an output in response to characteristics of a selection signal. A mux may select from one or more inputs based on a logic value, analog value, binary address, or other signal characteristic of a signal received at a select input known by those of ordinary skill in the art. A mux may also refer to a circuit configured to combine signals received at one or more inputs for transmission to a single output. Further, a mux may refer to a circuit configured to interleave two or more signals for transmission to a single output. Interleaving may occur in the time domain or the frequency domain. To simplify the drawings, the figures illustrate a functional representation of a mux as a trapezoidal shape. Each functional representation, however, may correspond to one or more multiplexer circuits configured to perform the desired operation as illustrated.

BIST data mux 204 includes preload mux 204a and user data mux 204b. Though illustrated as two separate multiplexers, BIST data mux 204 may be otherwise logically or physically organized into one or more multiplexers. That is, preload mux 204a and user data mux 204b, as shown in FIG. 3, illustrates a functional representation of the operation performed by BIST data mux 204. As illustrated in FIG. 3, preload mux 204a includes inputs coupled to pins BIST test data and memory pipeline output QP. Preload mux 204a provides single port access to access to input BIST test data and serial access to memory array 212, thereby reducing the port count for memory hard macro 200. Preload mux 204a also includes a select input coupled to pin preload. In normal BIST operation, preload mux 204a selects data received from BIST test data for transmission to the output of preload mux 204a. In BIST/IEEE1500 mode, preload mux 204a selects data received from QP. For example, in BIST/IEEE1500 mode, preload signal may be set to a value of logical "1", which selects memory pipeline data received from QP for transmission to user data mux 204b. User data mux 204b includes inputs coupled to the output of preload mux 204a and coupled to receive user data. User data mux 204b also includes a select input, coupled to BISTE pin, configured to select for transmission to the BIST mux output the output of preload mux 204a or user data.

In some embodiments, BIST address/control mux 206 may be configured to operate in a manner functionally similar to BIST data mux 204. BIST address/control mux 206 includes WEM mux 206a, ADDR mux 206b, and CTL mux 206c. Each of multiplexers WEM mux 206a, ADDR mux 206b, and CTL mux 206c have a select input coupled to receive BIST enable signal BISTE. WEM mux 206a includes inputs coupled to pins user WEM and BIST WEM, and an output WEM mux output. ADDR mux 206b includes inputs coupled to pins user ADDR and BIST ADR, and an output ADDR mux output. CTL mux 206c includes inputs coupled to pins user CTL and BIST CTL, and an output CTL mux output.

Figure 4:
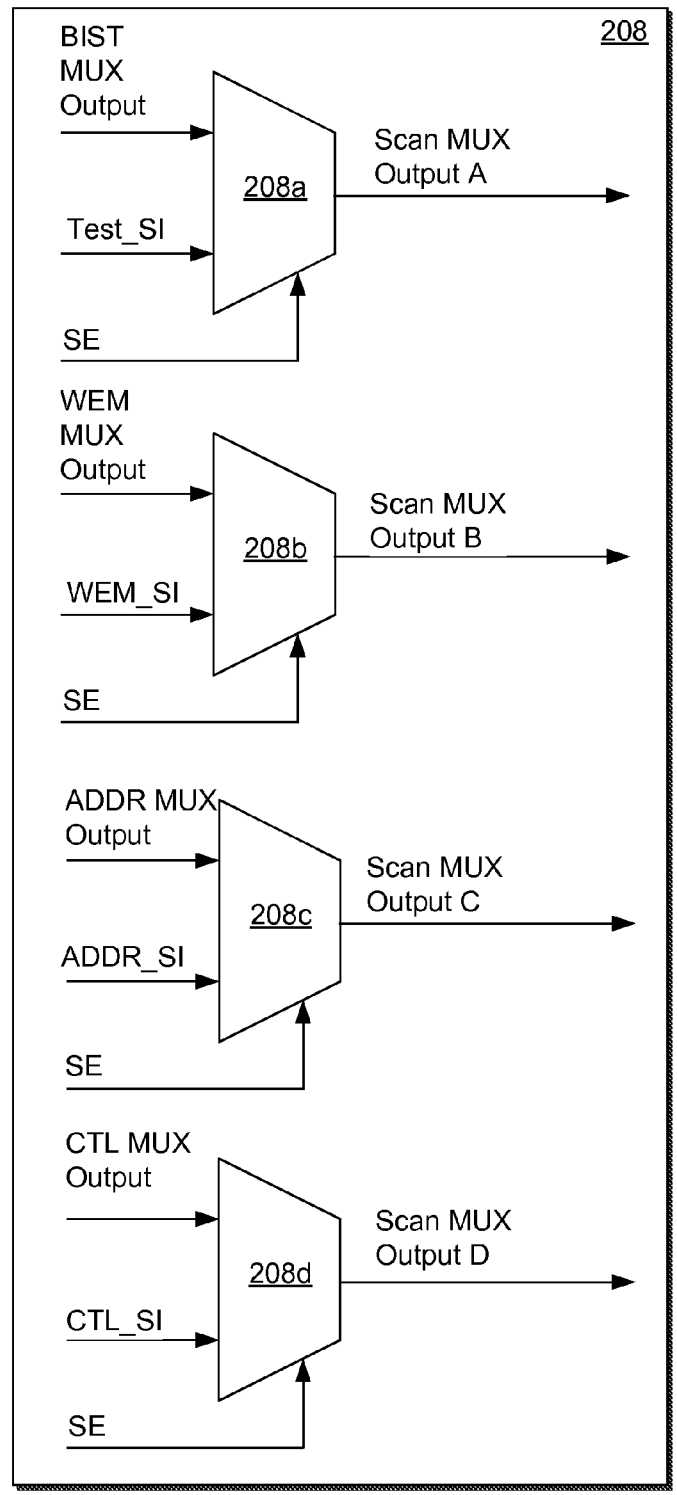
FIG. 4 illustrates a block diagram of an exemplary scan multiplexer circuit consistent with the disclosed embodiments.

FIG. 4 illustrates a block diagram of exemplary scan multiplexer circuit 208 consistent with the disclosed embodiments. As illustrated in FIG. 4, scan mux 208 may include one more multiplexer circuits 208a-208d, having inputs coupled to receive one or more outputs of BIST data mux 204 and BIST address/control mux 206, and ATPG scan inputs. For example, as illustrated in FIG. 4, scan mux A includes inputs coupled to BIST mux output and test scan input data from an external tester. Test scan input data may be any suitable pattern produced by an external memory tester as known by those having ordinary skill in the art. Scan mux B includes inputs coupled to WEM mux output and test scan input data from an external tester. Scan mux C includes inputs coupled to ADDR mux output and test scan input data from an external tester. Scan mux D includes inputs coupled to CTL mux output and test scan input data from an external tester.

In ATPG scan mode, scan mux 208 is configured to multiplex scan data and control information from an external tester for transmission to scan flop 210. In some embodiments, to operate scan mux 208 in ATPG scan mode, scan enable input SE may be set to a logical "1". In BIST mode, scan mux 208 is configured to multiplex the outputs of BIST data mux 204 and BIST address/control mux 206 for transmission to scan flop 210. To operate scan mux 208 in BIST mode, scan enable input SE may be set to a logical "1" or a logical "0" if a logical "1" places scan mux 208 in ATPG scan mode.

Figure 5:
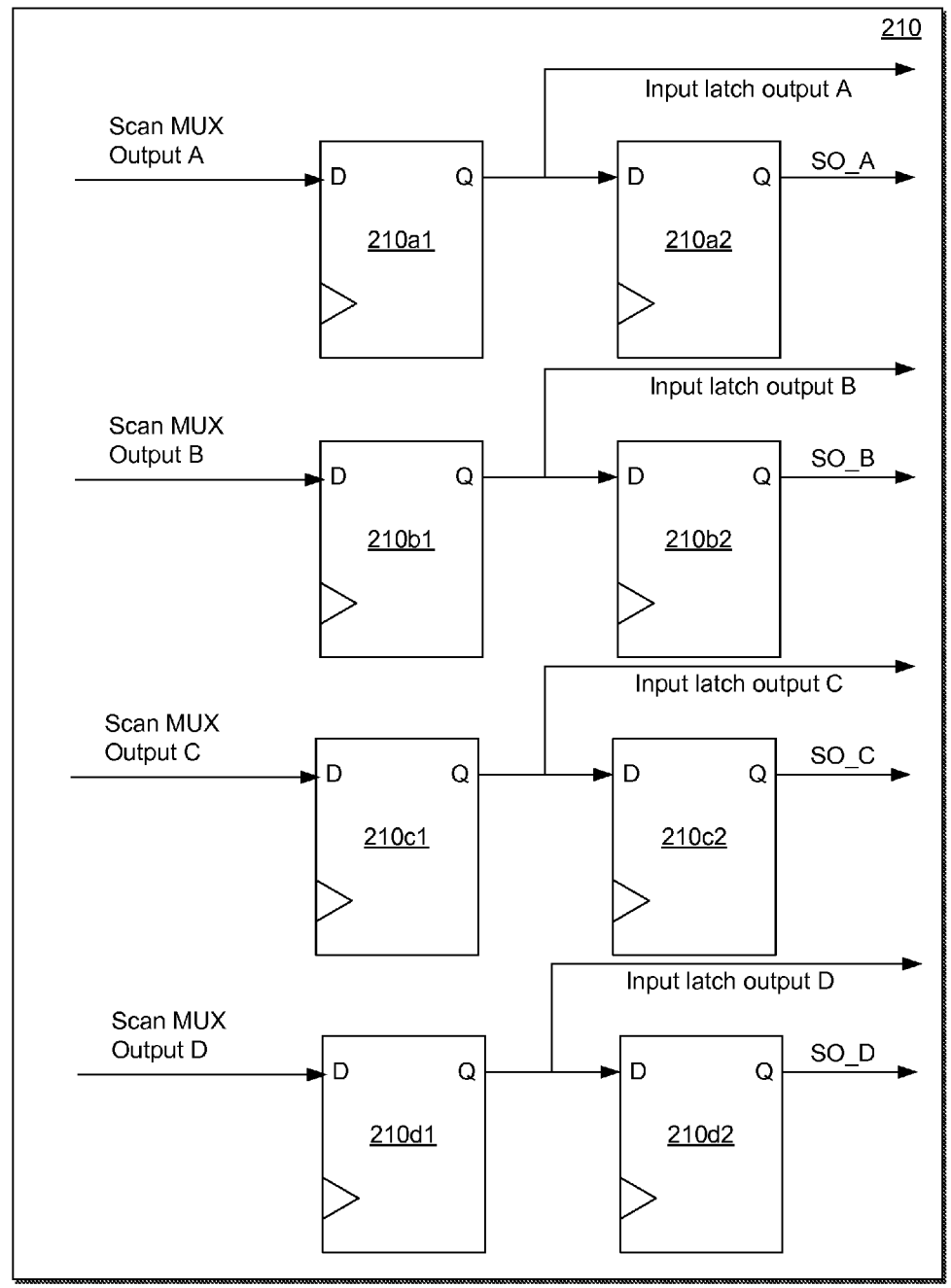
FIG. 5 illustrates a block diagram of an exemplary scan flop consistent with the disclosed embodiments.

FIG. 5 illustrates a block diagram of exemplary scan flop 210 consistent with the disclosed embodiments. As illustrated in FIG. 5, scan flop 210 may include a first series of input latch circuits 210a1-210d1 having outputs coupled to the inputs of a second series of latch circuits 210a2-210d2. A latch circuit may refer to any circuit configured to hold data in a ready position until required. As known by those of ordinary skill in the art, a pair of latch circuits may be coupled together to form a flip-flop or flop. As shown in FIG. 5, input latch circuits 210a1-210d1 are coupled to the inputs of latch circuits 210a2-210d2 to form scan flop 210. Although not shown in FIG. 5, scan flop 210 may include additional combinational logic or circuits between the output of latch circuits 210a1-210d1 and the input of latch circuits 210a2-210d2 suitable to generate output signals input latch outputs A-D.

In some embodiments, input latch circuits 210a1-210d1 may be located in peripheral circuitry included in the memory instance used to read data from and write data to memory array 212. That is, input latch circuits 210a1-210d1 may be included in the memory instance address logic to select rows and columns, write logic to store user data in the memory cells of memory array 212, output enable logic to control when data appears on the memory outputs, or other peripheral circuitry used in the functional operation of memory array 212. To perform the function of scan mux 210, a portion of the peripheral circuitry included in the memory instance, such as an output register latch, may be operationally coupled with one of test circuits input latches 210a2-210d2.

Figure 6:
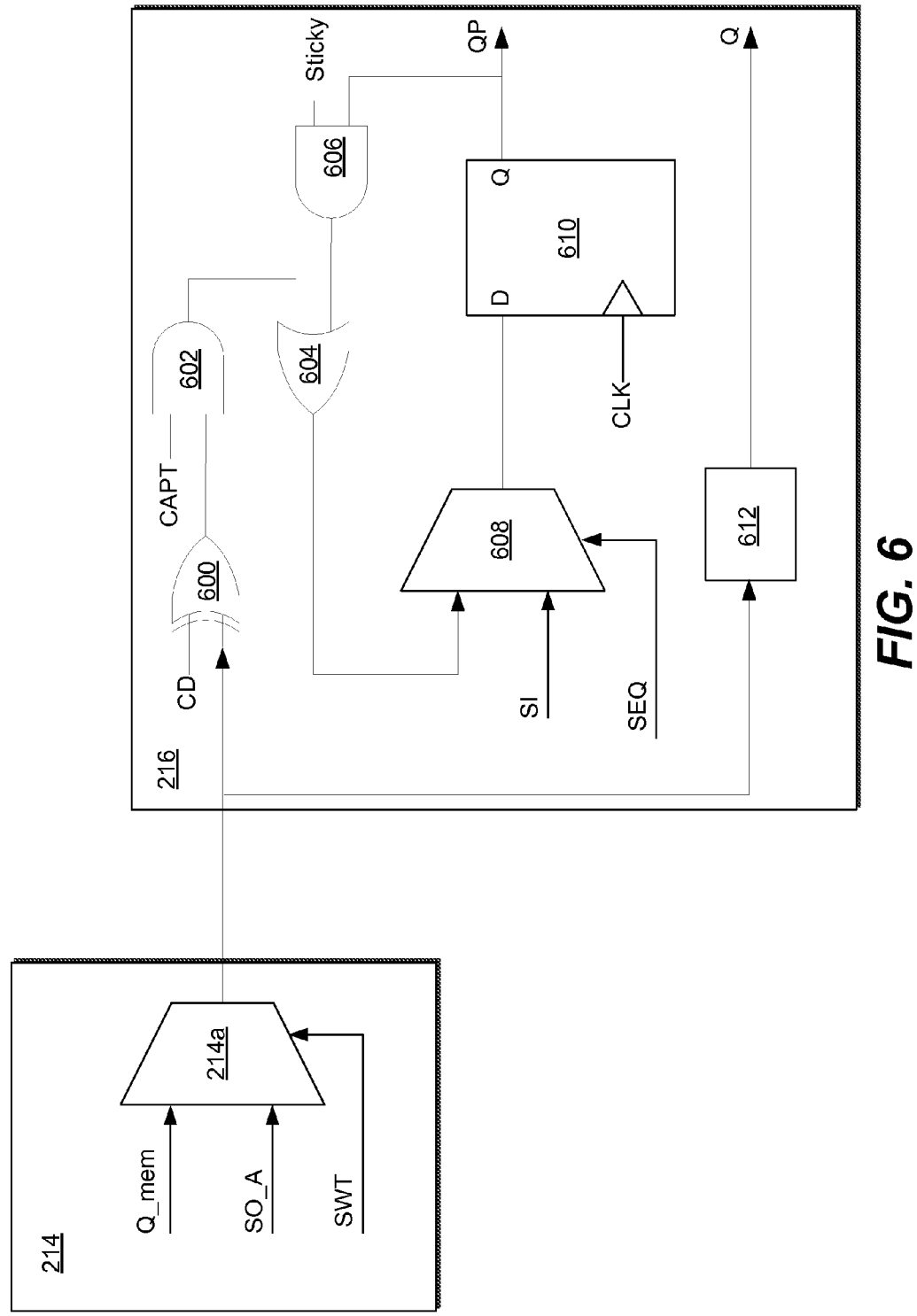
FIG. 6 illustrates a block diagram of an exemplary bypass multiplexer and BIST capture circuit consistent with the disclosed embodiments.

FIG. 6 illustrates a block diagram of exemplary bypass mux 214 and BIST capture circuit 216 consistent with the disclosed embodiments. As illustrated in FIG. 6, bypass mux 214 may be configured to bypass memory array 212 during ATPG scan mode based on bypass select signal SWT. Bypass mux 214 may include a first input coupled to receive the data output of memory array 212, and a second input coupled to receive the output input scan latch 210a2 included in scan mux 210, bypassing memory array 212. To operate bypass mux 214 in ATPG scan mode, bypass select signal SWT may be set to a logical "1", or a logical "0" if a logical "0" places bypass mux 214 in functional mode.

In some embodiments, BIST capture circuit 216 may be configured to compare the output from memory array 212 with a predetermined value or set of values. In other embodiments, BIST capture circuit 216 may be configured to compare scan test data output from scan mux 210 with another predetermined value or set of values. By way of example, and as shown in FIG. 6, BIST capture circuit 216 may include exclusive or gate 600, AND gate 602, OR gate 604, AND gate 606, multiplexer 608, flip-flop 610, and sense amplifier/latch 612. Exclusive or gate 600 has inputs coupled to receive the output of bypass mux 206 and compare data value CD. Depending on the operation mode, CD may be externally registered, operated under BIST control, or disabled. AND gate 602 may be coupled to receive the output of exclusive or gate 600 and coupled to receive capture enable signal CAPT. Depending on the operation mode, the CAPT may be externally registered, operated under BIST control, or enabled. OR gate 604 may be coupled to receive the output of AND gate 602 and the output of AND gate 606. AND gate 606 may be coupled to receive memory pipeline output QP from flip-flop 610 and data retention control signal DR_CTL. Depending on the operation mode, the DR_CTL may be externally registered, operated under BIST control, enabled, or disabled. Multiplexer 608 may include a first input coupled to the output of OR gate 604 and a second input coupled to ATPG scan input data from an external tester. Multiplexer 608 may also include a select input coupled to BIST capture circuit scan enable signal SEQ. Flip-flop 610 may be coupled to receive the output of multiplexer 608, memory clock CLK, and coupled to output memory pipeline output QP.

Embodiments consistent with the present disclosure may include alternative or additional combinational logic suitable to perform the desired function of BIST capture circuit 216 as discussed herein. Sense amplifier/latch 612 may be coupled to receive the output of bypass mux 214 and output a registered memory output signal Q. Although pictured as being located in BIST capture circuit 216, sense amplifier/latch 612 is located in peripheral memory circuitry included in the memory instance used to read data from memory array 212. For example, sense amplifier/latch 612 may be included in the memory instance and may be used to read bit lines within the memory array 212 during a read operation of memory array 212.

FIG. 7 illustrates a table of operational modes 700 of an exemplary memory hard macro consistent with disclosed embodiments. As illustrated in FIG. 7, and by way of example, memory hard macro 200 may operate in at least three embedded memory test operation modes, and a normal or functional operation mode.

During functional mode, BISTE is disabled or set to a logical "0" to a cause BIST data mux 204 to select test data input for transmission to scan mux 208, and to cause BIST address/control mux 206 to select user WEM, user ADDR, and user CTL for transmission to scan mux 208. Similarly, scan enable signal SE is also disabled or set to a logical "0", causing scan mux 208 to select the output of BIST data mux 204 and BIST addr/ctrl mux 206 for transmission to scan flop 210. Bypass select signal SWT is set to a logical "0" to cause bypass mux 214 to select data output Q_mem of memory array 212 for transmission to BIST capture circuit 216. Compare data value is disabled or set to a logical "0", causing the output of exclusive or gate 600 to track the logical value of Q_mem. BIST capture enable signal CAPT is set to a logical "1", causing the output of AND gate 602 to track the logical value of Q_mem. Data retention control signal DR_CTL is disabled or set to a logical "0", causing the output of AND gate 606 to be set to a logical "0". Because the output of 606 is set to a logical "0", the output of OR gate 604 also tracks the logical value of Q_mem. BIST capture circuit scan enable signal SEQ is disabled or set to a logical "0", causing multiplexer 508 to select the output of OR gate 604 for transmission to flip-flop 610. On the rising edge of memory clock CLK flip-flop 510 will shift data received at its input to its output as memory pipeline output signal QP. During functional mode, the values of signals preload, BIST data, BIST WEM, BIST ADDR, and BIST CTL do not affect the output of BIST capture circuit 216.

During functional mode, user data is received by BIST data mux 204 operating as a functional input port, and output by sense amplifier/latch 612 operating as a functional output port. In some embodiments, functional memory data path may include in the following order from the functional input port to the functional output port: an array of data buffer circuits including input latches included in the memory instance, such as one of latch circuits 210a1-210d1; an array of memory cells, such as memory array 212; and an array of sense amplifiers included in the memory instance, such as sense amplifier/latch 612.

During ATPG scan mode, memory array 212 may be bypassed asynchronously to provide at-speed ATPG testing, time-match with functional mode operation. During ATPG scan mode, the following signals are set in registers external to the memory device and associated with the ATPG test equipment: BISTE, CD, CAPT, DR_CTL, preload, BIST data, BIST WEM, and BIST CTL. To input scan data ATPG SI, SE input for one or more of scan muxes 208a-208d is enabled or set to a logical "1" to a cause the respective mux to select ATPG SI for transmission to scan flop 210. Scan flop 210 receives ATPG SI at one of latch circuits 210a1-210d1, and outputs ATPG SI to bypass mux 214 one the rising edge of memory clock CLK. By doing so, ATPG SI data is time-matched with functional mode operation. To output ATPG SI data to BIST capture circuit 216, SWT is enabled or set to a logical "1". ATPG SI data received at the input of multiplexer 608 may be output to flop 610 by setting SEQ to 1 under ATPG control. Once received by flop 610, ATPG SI data will appear on output QP on the subsequent clock cycle of CLK.

During ATPG scan mode, ATPG scan data is received by scan mux 208 operating as a scan input port, and output by sense amplifier/latch 612 operating as a scan output port. In some embodiments, scan data path may include in the following order from the scan input port to the scan output port: an array of scan flops, the scan flops including input latches included in the memory instance, such as one of latch circuits 210a1-210d1; bypass mux 214; and an array of sense amplifiers included in the memory instance, such as sense amplifier/latch 612. Scan data path bypasses memory array 212. During ATPG scan mode, the timing of scan data output from the scan output port is time matched with functional memory data output from the functional output port because latch circuits 210a1-210d1 are clocked together with sense amplifier/latch 612.

During BIST mode, preload is disabled or set to a logical "0", causing preload mux 204a to select BIST test data for transmission to user data mux 204b. BISTE is enabled or set to a logical "1" to a cause user data mux 204b to select BIST test data received from BIST data mux 204a for transmission to scan mux 208, and to cause BIST addr/ctrl mux 206 to select BIST WEM, BIST ADDR, and BIST CTL for transmission to scan mux 208. Scan enable signal SE is disabled or set to a logical "0", causing scan mux 208 to select the output of BIST data mux 204 and BIST addr/ctrl mux 206 for transmission to scan flop 210. Bypass select signal SWT is set to a logical "0" to cause bypass mux 214 to select data output Q_mem of memory array 212 for transmission to BIST capture circuit 216. Signals CD, CAPT, DR_CTL, SEQ, BIST data, BIST WEM, BIST ADDR, and BIST CTL operate under MBIST control. That is, these signal values are determined by MBIST controller, not shown, but having functionality known to those of ordinary skill in the art.

During BIST mode, BIST data is received by BIST data mux 204 operating as a BIST input port, and output by sense amplifier/latch 612 operating as a BIST output port. In some embodiments, BIST data path may include in the following order from the BIST input port to the BIST output port: at least one input latch included in the memory instance, such as one of latch circuits 210a1-210d1; an array of memory cells, such as memory array 212; and at least one output latch from an array of sense amplifiers included in the memory instance, such as sense amplifier/latch 612.

During IEEE1500 mode, memory array 212 may be accessed in a serial manner using preload mux 204a. During IEEE1500 mode, preload is enabled or set to a logical "1", causing preload mux 204a to select memory pipeline output data QP data for transmission to user data mux 204b. BISTE is enabled or set to a logical "1" to a cause user data mux 204b to select QP received from preload mux 204a for transmission to scan mux 208. Scan enable signal SE is disabled or set to a logical "0", causing scan mux 208 to select the output of user data mux 204b and BIST addr/ctrl mux 206 for transmission to scan flop 210. On the rising edge of memory clock CLK, input latch 210a1 will shift data received at its input to its output which is coupled to the data input of memory 212. Bypass select signal SWT is set to a logical "0" to cause bypass mux 214 to select data output Q_mem from memory array 212 for transmission to BIST capture circuit 216. Compare data value is disabled or set to a logical "0", causing the output of exclusive or gate 600 to track the logical value of Q_mem. BIST capture enable signal is configured to operate under MBIST control. Data retention control signal DR_CTL is enabled or set to a logical "1", causing the output of AND gate 606 to track the value of QP. Scan enable signal SEQ operates under MBIST control.

During IEEE1500 mode, serial data from memory pipeline data is received by BIST data mux 204 operating as a serial test input port, and output by flip-flop 610 operating as a memory pipeline output port. In some embodiments, serial test data path may include in the following order from the serial test input port to the memory pipeline output port: BIST data mux 204; at least one input latch included in the memory instance, such as one of latch circuits 210a1-210d1; an array of memory cells, such as memory array 212; bypass mux 214; and flip-flop 610 included in BIST capture cell 216. Transmission across serial test data path may be enabled using preload.

FIG. 8 illustrates a table of operational modes 800 of BIST capture circuit 216 consistent with disclosed embodiments. As illustrated in FIG. 8, and by way of example, BIST capture circuit 216 may operate according to the following modes: reset, pipeline, MBIST pass through, MBIST accumulate, IEEE1500 capture, shift, and data retention.

During reset mode, BIST capture circuit 216 is reset to set the values of QP and Q to a logical "0". The compare data function is inactive during reset mode. Accordingly, the value of CD does not affect the outputs of BIST capture circuit 216. BIST capture enable signal CAPT is disabled or set to a logical "0". It follows that the output of AND gate 602 will be a logical "0". Data retention control signal DR_CTL is disabled or set to a logical "0", causing the output of AND gate 606 to be set to a logical "0". Because the output of 606 is set to a logical "0" and the output of AND gate 602 is set to a logical "0", the output of OR gate 604 is also a logical "0". BIST capture circuit scan enable signal SEQ is disabled or set to a logical "0", causing multiplexer 608 to select the output of OR gate 604 for transmission to flip-flop 610. On the rising edge of memory clock CLK, flip-flop 510 will shift a value of logical "0" to its output as memory pipeline output signal QP.

During pipeline mode, data is read from memory array 212 and sequentially stored in flip-flop 610. During the following cycle, when a value is presented to the input of flip-flop 610, the data appears at the QP output. That is, data appears at QP one clock cycle after selecting an address corresponding to that data. During pipeline mode, CD is disabled or set to a logical "0", causing the output of exclusive or gate 600 to track the logical value of Q_mem. BIST capture enable signal CAPT is disabled or set to a logical "0". It follows that the output of AND gate 602 will be a logical "0". Data retention control signal DR_CTL is disabled or set to a logical "0", causing the output of AND gate 606 to be set to a logical "0". Because the output of 606 is set to a logical "0" and the output of AND gate 602 is set to a logical "0", the output of OR gate 604 is also a logical "0". BIST capture circuit scan enable signal SEQ is disabled or set to a logical "0", causing multiplexer 608 to select the output of OR gate 604 for transmission to flip-flop 610. On the rising edge of memory clock CLK, flip-flop 610 will shift a value of logical "0" to its output as memory pipeline output signal QP. Thus, the value of QP will reflect the value of Q_mem during the previous clock cycle, which is represented in as Q_mem$^{-1}$.

During MBIST pass through mode, the value of QP reflects a comparison of the value of Q_mem and CD at a given cycle of clock CLK. CD is set to value determined by the MBIST controller to reflect the expected value of Q_mem for a given clock cycle. Exclusive or gate 600 operates as a comparator, outputting a logical "0" if CD and Q_mem have the same value, or otherwise outputting a logical "1". BIST capture enable signal CAPT is enabled or set to a logical "1", causing the output of AND gate 602 to pass the comparison result. Data retention control signal DR_CTL is disabled or set to a logical "0", causing the output of AND gate 606 to be set to a logical "0". Because the output of 606 is set to a logical "0", the output of OR gate 604 tracks the comparison value. BIST capture circuit scan enable signal SEQ is disabled or set to a logical "0", causing multiplexer 608 to select the output of OR gate 604 for transmission to flip-flop 610. On the rising edge of memory clock CLK flip-flop 610 will shift the comparison value to output signal QP. Thus, in MBIST pass through mode, the value of QP will reflect a value indicating whether the expected value of Q_mem is the same or different from the actual value of Q_mem read from memory array 212.

During MBIST accumulate mode, BIST capture circuit 216 maintains a negative comparison result (e.g. a value of '1') until BIST capture circuit 216 is reset. CD is set to value determined by an MBIST controller to reflect the expected value of Q_mem for a given clock cycle. Exclusive or gate 600 operates as a comparator, outputting a logical "0" if CD and Q_mem have the same value, or otherwise outputting a logical "1". BIST capture enable signal CAPT is enabled or set to a logical "1", causing the output of AND gate 602 to pass the comparison result. Data retention control signal DR_CTL is enabled or set to a logical "1", causing the output of AND gate 606 to reflect the comparison value of the previous cycle of CLK. If the comparison value of the previous cycle of CLK is a logical "0", the comparison value of the present cycle of CLK will be output from OR gate 604. BIST capture circuit scan enable signal SEQ is disabled or set to a logical "0", causing multiplexer 608 to select the output the comparison value of the present cycle of CLK for transmission to flip-flop 610 and appear at QP on the subsequent clock cycle. In cases where the comparison value of the previous cycle of CLK is a logical "1", the output from OR gate 604 will be a logical "1", independent of the value of the comparison value determined during the present clock cycle. As long as BIST capture circuit scan enable signal SEQ is disabled or set to a logical "0", or until BIST capture circuit 216 is reset, QP will maintain a logic value of '1', indicating a negative comparison result captured during a previous cycle of CLK.

During IEEE1500 mode, data is read from memory array 212 and sequentially stored in flip-flop 610. On the clock cycle following when a value is presented to the input of flip-flop 610, the data appears at the QP output. That is, data appears at QP one clock cycle after selecting an address corresponding to that data. During IEEE1500 mode, CD is disabled or set to a logical "0", causing the output of exclusive or gate 600 to track the logical value of Q_mem. BIST capture enable signal CAPT is enabled or set to a logical "1", causing the output of AND gate 602 to track the logical value of Q_mem. Data retention control signal DR_CTL is disabled or set to a logical "0", causing the output of AND gate 606 to be set to a logical "0". Because the output of 606 is set to a logical "0", the output of AND gate 602 also tracks the logical value of Q_mem. BIST capture circuit scan enable signal SEQ is disabled or set to a logical "0", causing multiplexer 608 to select the output of OR gate 604 for transmission to flip-flop 610. On the rising edge of memory clock CLK, flip-flop 610 will shift a value of logic Q_mem to output signal QP. Thus, the value of QP will reflect the value of Q_mem during the previous clock cycle.

During shift mode, ATPG scan input data may be output from flip-flop 610 in a sequential manner during the rising edges of successive cycles of CLK. In this mode, BIST capture circuit scan enable signal SEQ is enabled or set to a logical "1", causing multiplexer 608 to select ATPG scan input data for transmission to flip-flop 610, and output to QP. Because BIST capture circuit scan enable signal SEQ is enabled, the remaining inputs to BIST capture circuit 216 do not affect the output QP.

During data retention mode, BIST capture cell 216 maintains its previous state. CD is disabled or set to a logical "0", causing the output of exclusive or gate 600 to track the logical value of Q_mem. BIST capture enable signal CAPT is disabled or set to a logical "0". It follows that the output of AND gate 602 will be a logical "0". Data retention control signal DR_CTL is enabled or set to a logical "1", causing the output of AND gate 606 to reflect the value of QP from the previous cycle of CLK. Because the output of AND gate 602 is held at a logical "0" during this mode, the output of OR gate 604 tracks the value of the output of AND gate 606, which reflects the value of QP from the previous cycle of CLK. BIST capture circuit scan enable signal SEQ is disabled or set to a logical "0", causing multiplexer 608 to select the value of QP from the previous cycle of CLK for transmission to flip-flop 610. On the rising edge of memory clock CLK, flip-flop 610 will shift the value of QP from the previous cycle of CLK output signal QP, maintaining its previous state.

In other embodiments, a memory compiler may be configured to compile a memory hard macro consistent with the disclosed embodiments. For example, a memory compiler may be configured to compile at least one SRAM memory instance based on instructions 124 executed by processor 102. The memory compiler may be configured to generate circuit instances included in memory hard macro 200, and to generate a layout of memory hard macro 200 consistent with the disclosed embodiments. By generating a layout of memory hard macro 200, timing associated with the functional data path, scan data path, BIST data path, and serial test data path are closed inside memory hard macro 200 during the memory design phase. Thus, reducing the burden of closing timing for each data path and the functional memory data path.

Various embodiments have been described herein with reference to the accompanying drawings. It will, however, be evident that various modifications and changes may be made thereto, and additional embodiments may be implemented, without departing from the scope of the disclosure as set forth in the claims that follow.

Further, other embodiments will be apparent to those skilled in the art from consideration of the specification and practice of one or more the embodiments disclosed herein. It is intended, therefore, that this disclosure and the embodiments herein be considered as exemplary only, with a true scope and spirit of the disclosure being indicated by the following listing of exemplary claims.

What is claimed is:

1. A circuit included in an embedded memory, the circuit comprising:

a functional input port, a functional output port, and a functional memory data path from the functional input port to the functional output port, the functional memory data path comprising:
  an array of data buffer circuits including input latches located in peripheral memory circuitry included in a memory instance instantiated on a die,
  an array of memory cells, and
  an array of sense amplifiers included in the memory instance, the array of sense amplifiers including output latches located in the peripheral memory circuitry included in the memory instance;
a scan input port, a scan output port, and a scan data path from the scan input port to the scan output port, the scan data path comprising:
  an array of scan flops, at least one scan flop in the array of scan flops comprising:
    an input latch located in the peripheral memory circuitry, and
    an additional output latch located in the in test logic separate from the memory instance, the additional output latch having an input coupled to the memory array and coupled to receive the output from the input latch located in the peripheral memory circuitry, the additional output latch having an output coupled to the scan output port;
  wherein the scan output port of the scan data path bypasses the array of memory cells; and
a built-in self-test (BIST) input port, a BIST output port, and a BIST data path from the BIST input port to the BIST output port, the BIST input port operating as the functional input port when a BIST enable signal is set to a first logic level to enable transmission of functional data through BIST data path and operating in BIST mode when the BIST enable signal is set to a second logic level to enable transmission of BIST test data through the BIST data path, the BIST data path comprising:
  at least one input latch from the input latches located in the peripheral memory circuitry;
  the array of memory cells, and
  at least one output latch from the output latches located in the peripheral memory circuitry included in the memory instance.

2. The circuit of claim 1, wherein timing of functional memory data output from the functional output port is matched to timing of scan data output from the scan output port.

3. The circuit of claim 1, wherein the input latches and output latches are clocked together.

4. The circuit of claim 1 further comprising a preload port, a serial test input port, a memory pipeline output port, and a serial test data path, the preload port configured to enable transmission through the serial test data path, the serial test data path comprising:
  a BIST multiplexer circuit;
  the at least one input latch from the array of data buffer circuits;
  the array of memory cells;
  a bypass multiplexer circuit; and
  a BIST capture circuit.

5. The circuit of claim 4, wherein the BIST multiplexer circuit includes a select input coupled to the preload port to select from at least one of the serial test data received at a first input port and memory pipeline output data received at a second input port.

6. The circuit of claim 1, wherein the scan flops includes scan input latches coupled to receive outputs of the input latches included in the peripheral memory circuitry and having outputs configured to output scan test data to a bypass multiplexer circuit.

7. The circuit of claim 1, wherein the embedded memory instance being an embedded Static Random Access Memory (SRAM).

8. The circuit of claim 1, wherein the array of memory cells operate in functional mode without a refresh cycle.

9. The circuit of claim 1, wherein timing associated with each of the functional data path, scan data path, and BIST data path is closed inside the embedded memory during a memory design phase.

* * * * *